(12) United States Patent
Hirani et al.

(10) Patent No.: US 11,402,534 B2
(45) Date of Patent: Aug. 2, 2022

(54) METAL DETECTOR

(71) Applicant: ILLINOIS TOOL WORKS INC., Glenview, IL (US)

(72) Inventors: Hitesh Ratna Hirani, Glenview, IL (US); Vit Chomat, Glenview, IL (US); Lukas Beneda, Glenview, IL (US)

(73) Assignee: Illinois Tool Works Inc., Glenview, IL (US)

( * ) Notice: Subject to any disclaimer, the term of this patent is extended or adjusted under 35 U.S.C. 154(b) by 1024 days.

(21) Appl. No.: 16/065,635

(22) PCT Filed: Dec. 22, 2016

(86) PCT No.: PCT/US2016/068294
§ 371 (c)(1),
(2) Date: Jun. 22, 2018

(87) PCT Pub. No.: WO2017/112862
PCT Pub. Date: Jun. 29, 2017

(65) Prior Publication Data
US 2021/0199835 A1   Jul. 1, 2021

(30) Foreign Application Priority Data

Dec. 23, 2015   (GB) ..................... 1522716

(51) Int. Cl.
*G01V 3/10*   (2006.01)
*H01F 27/36*   (2006.01)
*H05K 9/00*   (2006.01)

(52) U.S. Cl.
CPC .......... *G01V 3/104* (2013.01); *H01F 27/363* (2020.08); *H05K 9/0049* (2013.01); *H05K 9/0047* (2013.01)

(58) Field of Classification Search
CPC . G01V 3/104; G01V 3/10; G01V 3/08; G01V 3/38; G01V 13/00; H01F 27/363;
(Continued)

(56) References Cited

U.S. PATENT DOCUMENTS

| | | | | |
|---|---|---|---|---|
| 4,814,734 A | * | 3/1989 | Moran | G01V 3/10 29/605 |
| 4,870,381 A | * | 9/1989 | Moran | G01V 3/10 336/84 C |

(Continued)

FOREIGN PATENT DOCUMENTS

| | | |
|---|---|---|
| DE | 19830584 | 5/1999 |
| GB | 2205408 | 12/1988 |

(Continued)

OTHER PUBLICATIONS

Dowel, available at https://en.wikipedia.org/wiki/Dowel on Nov. 7, 2015 (Year: 2015).*

(Continued)

*Primary Examiner* — Daniel R Miller
(74) *Attorney, Agent, or Firm* — McAndrews, Held & Malloy, Ltd.

(57) ABSTRACT

A panel (31) for assembly into a sensing head for a metal detector comprising: a. a first layer (34) for supporting at least one sensing coil (33), b. a second layer (35) for providing electromagnetic shielding, and c. a moisture resistant barrier layer (36).

19 Claims, 5 Drawing Sheets

(58) Field of Classification Search
CPC .... H01F 27/36; H05K 9/0049; H05K 9/0047; G01N 27/72
See application file for complete search history.

(56) References Cited

U.S. PATENT DOCUMENTS

| | | | |
|---|---|---|---|
| 5,066,937 A | | 11/1991 | Moran |
| 5,307,042 A | * | 4/1994 | Papa, Jr. ................ G01V 3/107 29/602.1 |
| 5,929,634 A | * | 7/1999 | Artinger ................ G01V 3/104 324/233 |
| 6,107,355 A | * | 8/2000 | Horn .................... C08G 18/242 521/51 |

FOREIGN PATENT DOCUMENTS

| | | |
|---|---|---|
| GB | 2267351 | 12/1993 |
| WO | 95/11462 | 4/1995 |
| WO | 2015092010 | 6/2015 |

OTHER PUBLICATIONS

Dovetail joint, available at https://en.wikipedia.org/wiki/Dovetail_joint on Oct. 5, 2015 (Year: 2015).*

O-ring, available at https://en.wikipedia.org/wiki/O-ring on Nov. 5, 2015 (Year: 2015).*

Extended European Seach Report Appln No. 201671609 dated Jul. 10, 2020 (9 pgs).

International Search Report and Written Opinion corresponding to International Patent Application No. PCT/US2016/068294, dated Mar. 14, 2017.

* cited by examiner

METAL DETECTOR

RELATED APPLICATIONS

This international application claims priority to United Kingdom Patent Application Serial No. GB1522716.8, filed 23 Dec. 2015. The entirety of United Kingdom Patent Application Serial No. GB1522716.8 is incorporated herein by reference.

FIELD OF INVENTION

The present invention relates to an apparatus for detecting contaminants. More particularly but not exclusively the present invention relates to an apparatus for detecting metal in foodstuffs.

INTRODUCTION

Foreign bodies in their products are one of the biggest sources of customer complaints for many food manufacturers and retailers. Such foreign bodies can be any undesirable solid objects and include items entirely unconnected with the food such as glass or metal fragments, as well as those related to the food such as bones. One of the biggest concerns for the food processing industry is the unwanted inclusion of metallic particles or metallic items in the food product as a result of processing. For example, typical metal inclusions range from nuts or washers lost from the processing machinery or dropped during maintenance etc. to metal shavings, e.g. produced by mechanical wear.

Such metal inclusions will not only compromise product safety and raise health concerns but also have a negative impact on the food manufacturer's and ultimately the retailer's reputation. Legislation has demanded that food manufacturing industries should provide effective measures to prevent the presence of foreign bodies in the food product. Compliance with this requirement may be accomplished by using sieves, traps or more sophisticated techniques such as metal detectors. Due to the risk of damage to their reputation, more stringent quality control measures now expected by most food retailers are forcing food manufactures to use more up-to-date metal detection techniques.

Apparatus for detecting metal contaminants in food products is well known in the industry and is described for example in WO 02/25318 (Safeline Limited) and WO2006/087510 (Spectrum Inspection Systems Limited). A typical metal detector shown in FIG. 1 of WO2006/087510 (Spectrum Inspection Systems Limited) consists of a metal detector search head with an aperture through which the product passes and a control unit which processes the signals from the head. Inside the head there is a three coil system surrounding the aperture. A transmitter coil surrounding the aperture with its axis arranged parallel to the conveying direction is connected to a high frequency generating circuit. Above and below the aperture are receiver or detection coils with their axes arranged vertically. The two receiver coils are identical and are placed the same distance from the transmitter coil, so that in the absence of any disturbance of the varying magnetic field inside the search head, they receive the same signal and produce an identical output voltage. The receiver coils are connected in opposition such that in absence of any object their induced voltages oppose one another and thereby cancel each other out resulting in a zero output signal. This is the condition when the coil system is in a perfectly balanced state.

As taught in WO 2006/087510 (Spectrum Inspection Systems Ltd), the detection coils are arranged in a plane perpendicular to the direction in which the product is to pass and electrically connected in parallel and each detection coil is located on one side of the product only. The transmitter (drive) coil is arranged in a plane perpendicular to the product conveying direction and is driven by a powerful oscillator capable of generating a strong high frequency field within the aperture through which the product passes.

When an electrically conductive particle passes through the coils of the metal detector, the high frequency field is disrupted through the receiver coils due to induced currents in the particle's surface which causes slight changes in the balance condition, e.g. by a few microvolts, resulting in the output from the coils no longer being zero. Suitable amplification and processing is used to trigger an automatic reject alarm.

Typically detectors are encased in a metal box which houses the coil components around a non-electrically conductive former. Traditionally, the non-electrically conductive former is secured in position within the metal box by filling the space or cavity between the metal box and the non-electrically conductive former with a filler. Typical the filler material include resins, concrete, grout, rubber or a combination thereof. Since only the ends of the former are fixed to the walls of the metal box, the resin surrounding the former ensures the stability and structural integrity of the former within the metal box housing. This prevents the former from moving within the metal box which could potentially affect the calibration of the detection coils. The aperture, or tunnel, through which the products pass, is usually lined with a hygienic, non-metallic material, generally plastic. The ratio of the aperture to the size of the product is important in ensuring optimum performance. This is because the sensitivity of the detector is measured at the geometric centre of the aperture. The geometric centre of the aperture is the location where sensitivity is lowest, thus sensitivity is inversely proportional to the size of aperture, in particular, to the smaller of the two sides.

Between the liner and coil components is placed a screen configured as an electric field shield (also known in the art as an electromagnetic shield). This screen comprised of electrically conductive material, for example copper or graphite, acts to stabilize capacitance between coils and the product to be tested or inspected. Further details of the types of electric field shielding is discussed in WO 2014/055732 (Whaley, Brain, A). In the fabrication of the metal detector, the layers of the screen and the liner are built up in-situ in the aperture of the metal detector.

Furthermore this shielding can be configured to reduce the effect on the metal detector head from changing capacitance caused by objects in the external magnetic field. The shielding can also be fabricated and/or configured in such a way to reduce eddy and loop currents, which generate magnetic fields opposing and therefore reducing the desired field. Such shielding may be a woven metal mesh, such as screen materials formed of non-magnetic metal, such as copper or brass. The shielding can also comprise other nonmagnetic metal materials, such as metal films deposited on flexible substrates, metal wiring patterns formed on thin substrates such as printed circuit boards, or other thin film materials known in the art. For shielding comprised of metal film deposited on substrates, such substrates can be flexible substrates such as polyester or polyimide. For shielding comprised of wiring patterns, the wiring can be formed/etched/fabricated in manners consistent with existing printed circuit board (PCB) construction. All such metal films would be some non-magnetic metal, such as aluminium or copper. Further, such metal screens or films can be fabricated or placed to prevent current loops from forming in the shielding. For example, for shielding comprised of metal mesh or screen, the shielding can be configured with one or more gaps to prevent such loop or eddy currents from forming within the mesh.

Within the food processing industry it is obvious that the highest standards of cleanliness and safety must be kept in accordance with stringent regulation. A variety of aperture barrier linings exist that allow these standards to be met, commonly these include: self-levelling epoxy resin—hand laid to a thickness in the range 3 mm to 10 mm, high-density polyethylene (HDPE) moulding (thickness in the range 3 mm to 20 mm) and acetal copolymer (POM-C) (thickness in the range 3 mm to 20 mm). Each of these has advantages and disadvantages.

Epoxy resin is advantageous because it can be smoothed out to a very thin coating (in the range of 3 mm), as a fluid it fills gaps and once solidified provides an easy-wipe-down surface on which can be used hazardous cleaning chemicals which could corrode other, less resilient more permeable materials. There exist a number of problems with the use of Epoxy resin. Being a fluid, it must be applied directly to the detector apparatus and care must be applied when pouring to ensure that the thickness is as uniform as possible; the resin can never be made perfectly smooth thus cleaning is not as effective as it could be; the drying time required for the fluid to set slows production considerably and once solidified, the resin cannot be remoulded without considerable effort. Additionally, over time Epoxy resin can crack as a result of exposure to large temperature differentials experienced in operation and cleaning; this cracking may be exacerbated by bubbles formed in the resin during initial application that structurally weaken the solidified/cured resin structure. This is particularly troublesome as once cracks develop, cleaning fluids permeate through the lining resulting in the corrosion of internal components such as the shielding or even the coil components thus having a negative impact the detector's performance. The edges of the resin surface also require sealing such that fluid does not breach the internal components.

HDPE and POM-C moulded liners use simple rubberised seals or adhesives to create water tight surroundings; for this reason, they offer very operationally useful surfaces; they are compatible with the use of high pressure water cleaning methods, high temperatures and as such are suitable for use with food products that require the highest levels of food preparation regulation. Problems associated with the use of these moulded liners include that the liner has a large thickness, around or up to 20 mm Having four sides with such a thickness results in the liner occupying a large volume of the available detecting volume, this reduces the product size that the detector can handle. To accommodate the large liner thickness whilst retaining the standard aperture size, it is necessary to place the coils further away from the centre of the aperture, thus decreasing detection sensitivity. One additional disadvantage of the use of moulded liners is that the moulded liner must be fixed individually into the detecting aperture which takes time in production.

U.S. Pat. No. 5,066,937 (Moran James M) teaches a search coil assembly comprising a frame assembly having an aperture therethrough and electrically conductive strands wound upon the frame assembly. The frame assembly comprises a plurality of laminated frame members joined together by gluing so as to define the aperture, each of the frame members comprising first and second sheets of rigid plastic bonded together with an electrically conductive material disposed therebetween. Potting plastic is disposed on the external surfaces of the frame assembly embedding the electrically conductive strands and a metal housing encloses the potting plastic.

The use of resin and in some cases a concrete based filler material to secure the former or search coil assembly within the metal box housing significantly adds to the overall weight of the metal detector, which in turn results in higher shipping costs.

There therefore exists a need for a metal detector that minimises the time that is required to assemble the metal detector; complete with coil components, shielding, liner and signal processing components whilst providing an internal detecting environment suitable for handling products that require strict controls on cleanliness and yet have a metal detector whereby the overall weight of the metal detector is lighter than traditional resin filed metal detectors so as to mitigate increased shipping costs.

SUMMARY OF THE INVENTION

The present invention addresses the above problems by providing a sensing head insert for a metal detector comprising an assembly of panels having a product sensing aperture for receiving products to be tested, each of said assembly of panels comprising a laminated assembly of:
 a first layer for supporting at least one sensing coil,
 a second layer for providing electromagnetic shielding, and
 a moisture resistant barrier layer;
 wherein adjacent panels are secured together by a mechanical fastener; said mechanical fastener comprising:
  i) one or more screws or dovetail joints; and
  ii) an adhesive; and
  iii) an alignment means configured for aligning the panels at a pre-determined orientation to each other, wherein the alignment means comprises alignment pins and alignment holes arranged so that the pins and holes of different panels cooperate.

In traditional sensing heads for metal detectors excessive time and labour is spent assembling the three individual required components in-situ within the body of the metal detector; a coil supporting first layer, an electric field shielding (also known in the art as electromagnetic shielding) second layer and a moisture resistant barrier layer. To address this, a panel is fabricated as a laminated assembly that incorporates the three layers. The panels can be assembled into a sensing head insert for a metal detector. The use of panels allows the sensing head to have a number of different shaped configurations for different shaped apertures with minimal effort required to go between each configuration.

To reduce the weight of the metal detector, the space or cavity between the sensing head insert and the metal detector outer housing is substantially filled with foam, more preferably, an expanding foam. Traditionally the metal detector housing is composed of metal, more particularly sheet metal. However, other types of materials of the metal detector housing are permissible in the present invention including but are not limited to plastics. The advantage of the use of an expanding foam is that not only is the foam material a lighter material than traditional filling materials, e.g. resin but also ensures the stability and structural integrity of the sensing head insert within the metal detector outer housing, particularly during movement of the metal detector, e.g. transport. Furthermore, the use of foam greatly reduces and removes the generation of voids between the sensing head insert and the metal detector outer housing which result in the need to make significant recalibration of the metal detector through movement of the sensing head insert. However, the problem with the use of expanding foam is the pressure built up in the cavity between the metal detector housing and the insert as a result of the expanding nature of the foam generating a force sufficient to cause damage to components internal of the metal detector housing, in particular to the sensing head insert or the former. Additional problems include subsequent delamination of the foam from the internal surfaces of the walls of the metal detector housing when the expandable foam precursor material cures.

To mitigate the excessive build of pressure in the cavity causing damage to the insert or former, one or more pressure release vents or valves are mounted to the metal detector housing. The pressure release vents allows excess expandable precursor foam material to expand through the vents during curing stage. However, the excessive use of pressure release vents removes the filing capacity of the expandable foam to the extent that the foam does not adequately fill all of the available space between the metal detector outer housing and the sensing head insert or former due to the density of the cured foam being too low and therefore weak, which in turn results in inadequate support of the sensing head insert from movement within the metal detector housing. As a result, the use of expandable foam to fill the cavity between the metal detector outer housing and the sensing head insert was not considered a viable proposition in the industry.

The present invention provides a sensing head insert that is structurally rigid, provided by the alignment and securing means manifested within the panels as for example pins, screws or dovetail joints. More specifically, adjacent panels are secured together by a mechanical fastener; said mechanical fastener comprising:
  i) one or more screws or dovetail joints; and
  ii) an adhesive; and
  iii) an alignment means configured for aligning the panels at a pre-determined orientation to each other, wherein the alignment means comprises alignment pins and alignment holes arranged so that the pins and holes of different panels cooperate.

The combination of the mechanical fastener joining adjacent panels together comprising one or more screw or dovetail joints and an adhesive and an alignment means configured for aligning the panels at a pre-determined orientation to each other, wherein the alignment means comprises alignment pins and alignment holes arranged so that the pins and holes of different panels cooperate is necessary in the present invention in order to withstand the forces experienced by the expandable foam and yet have the ability to ensure the foam substantially fills the space or cavity between the metal detector housing and the sensing head insert to the required density. The absence of any one of these mechanical fasteners results in the sensing head insert collapsing under the pressure of the expandable foam or damage to the joint between adjacent panels. For example, just gluing adjacent panels together would not be sufficient to withstand the forces acting on the sensing head insert. Optionally, one or more pressure release vents mounted to the metal detector housing can be used in combination with the mechanical fastener of the present invention to control the packing density of the expandable foam within the metal detector housing. Optionally, the foam is a polyurethane based foam, more preferably the foam precursor expands into a polyurethane rigid foam having a closed-cell structure. Optionally, the packing density of the polyurethane foam is in the range 0.20 g/cm$^3$-0.40 g/cm$^3$; preferably 0.25-0.35 g/cm$^3$; more preferably 0.25 g/cm$^3$-0.30 g/cm$^3$. Ideally, the density of the foam is 0.27 g/cm$^3$. Having a packing density of the polyurethane foam in the range of 0.20-0.40 g/cm3; preferably 0.25-0.35 g/cm$^3$; more preferably 0.25 g/cm$^3$-0.30 g/cm$^3$, ensures adequate stability of the sensing head insert or former within the metal detector housing.

An assembled insert comprises hermetic seals between adjacent panels such that the product sensing aperture is fluid tight thus protecting the electric field shield and sensing coils from damage during operation and cleaning.

The manufacture of the individual panels or their assembly can be outsourced for delivery to the final metal detector manufacturer with or without sensing coils mounted thereon. The metal detector manufacturer is thus able to concentrate their work and time on building the complicated electronic circuitry in which their specialism lies.

The assembled insert is inserted to a metal detector comprising a metal detector aperture for housing the insert. The assembled insert holds further advantages over assembling each layer of component in-situ: the distance between sensing coils and the centre of the product sensing aperture can be minimised whilst maintaining standard sizes of product sensing aperture, for example a 300 mm by 150 mm aperture opening; this minimisation results in a maximisation of metal detector sensitivity; does not suffer from the problems associated with casting a resin into the aperture of the metal in-situ. The present invention further provides a metal detector comprising a an insert of the present invention housed within a metal detector housing; said metal detector housing comprising a metal detector aperture in cooperation with the product sensing aperture of the insert, wherein the space between the metal detector housing and the insert is substantially filled with foam, more preferably an expandable foam.

The present invention provides a method for manufacturing a panel, comprising the step of bonding layers of:
  a. a first layer for supporting at least one sensing coil;
  b. a second layer for providing electromagnetic shielding, and
  c. a moisture resistant barrier layer.

The present invention provides a method for manufacturing an insert, comprises the steps of:
  a. assembling panels according to the present invention to form an insert comprising a product sensing aperture.

The present invention provides a method for assembling a sensing head into a metal detector comprises the steps of:
  a. inserting the insert into a metal detector housing aperture;
  b. sealing the insert to the metal detector housing aperture.

The present invention further provides a method for manufacturing a metal detector comprising the step of:
  a. fixing an insert of the present invention to an aperture of a metal detector housing;
  b. injecting expandable precursor foam material in the space between the metal detector housing and the insert such that the insert is surrounded by expandable foam.

Preferably the insert is sealed into the metal detector housing aperture by injecting a sealant between the insert and the interior surface of the metal detector housing aperture.

BRIEF DESCRIPTION OF THE DRAWINGS

Further features and aspects of the present invention will be apparent from the claims and the following illustrative description made with reference to the accompanying drawings in which:

DETAILED DESCRIPTION

The present invention relates to an insert for use with a metal detector, more particularly an insert built with a lamination including at least three layers. A first layer is a former configured to support sensing coils for transmitting and detecting changes in electromagnetic fields; a second layer is a shielding layer of electrically conductive material; a third layer being a moisture resistant barrier. The insert of the present invention can be manufactured as a single or integral unit or a collection of panels that can be assembled to form an insert for insertion into an aperture of a metal detector to form a product sensing aperture.

Figure 1:
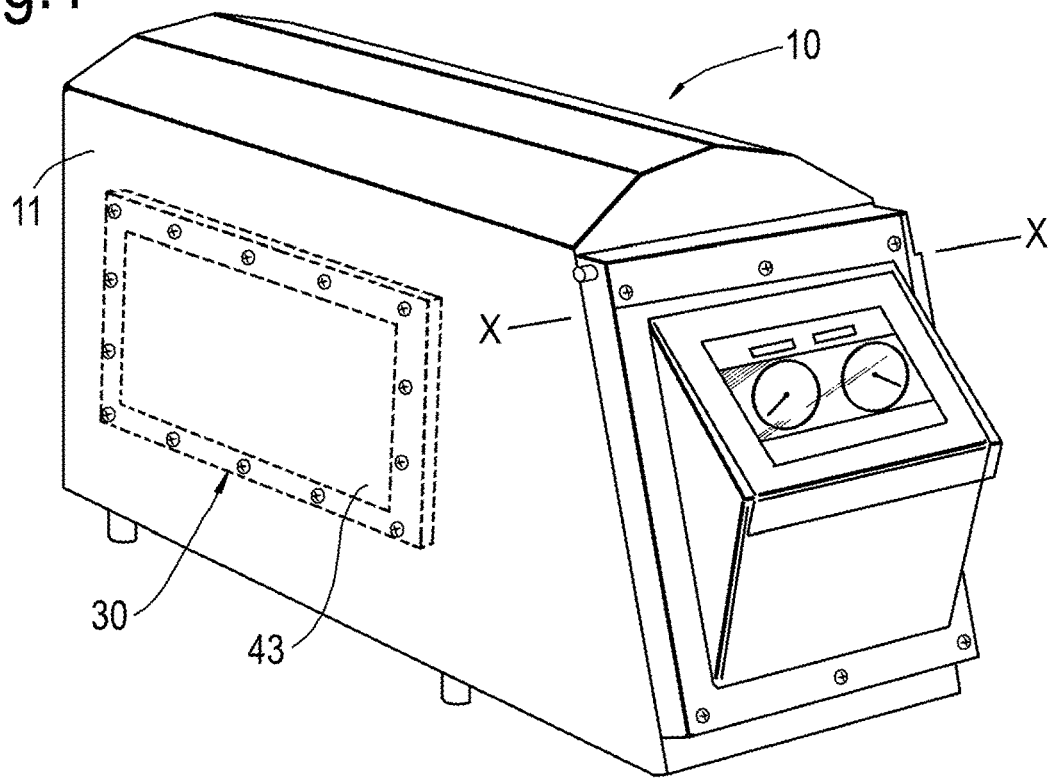
FIG. 1 is a schematic view of a metal detector according to an embodiment of the present invention.

In the metal detector 10 of the present invention as shown in FIG. 1, the metal detector 10 comprises: a housing 11 comprising, electronic circuitry (not shown) configured to power the transmitter of an initial sensing signal and for processing a detected signal, a housing aperture 20 (not shown) to which an insert can be secured to form a product sensing aperture 43 through which can be passed objects of interest and an insert 30. In the particular embodiment shown in FIG. 1 a frame (shown as a dotted line) can be used to fix the insert to the metal detector housing aperture 20. However, the frame is optional and the insert 30 can be fixed or bolted directly to the metal detector housing aperture 20.

The housing aperture 20 comprises at least one electrical contact point 21 (not shown) that facilitates the connection between the insert 30 and the electronic circuitry within the housing 11, these at least one electrical contact points 21 are optionally designed such that once connection is complete; the connection is sealed to prevent fluid from damaging or interfering with signals passed over the connection by for example a fluid tight enclosure.

Figure 2:
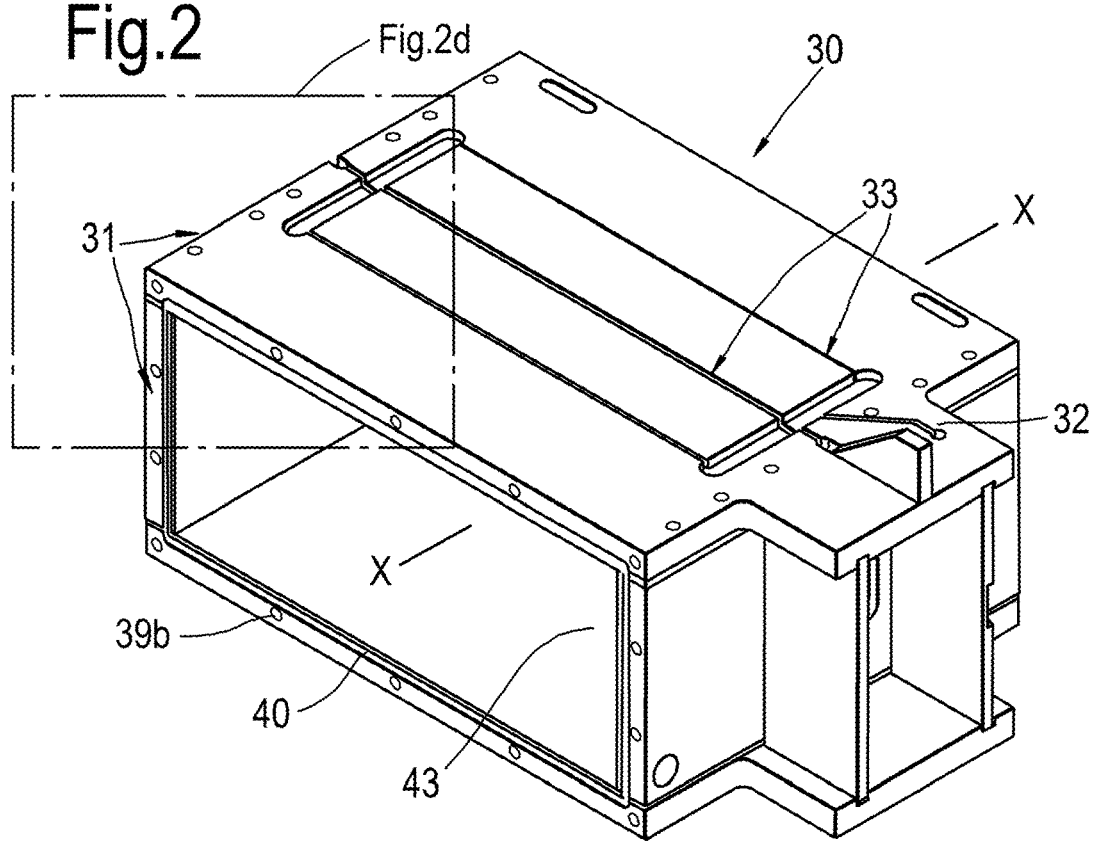
FIG. 2 is a schematic view of an assembled sensor head insert according to an embodiment of the present invention.
Figure 4:
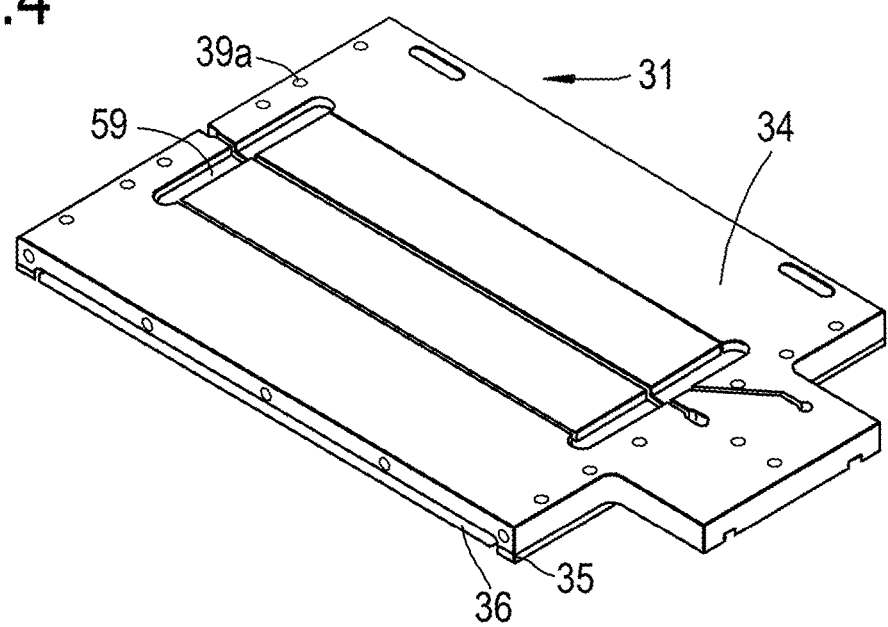
FIG. 4 is a schematic view of a panel for assembly into a sensing head insert for a metal detector according to an embodiment of the present invention.

The assembled insert 30 is fabricated as a single or integral unit as shown in FIG. 2. This single unit is comprised of a plurality of panels 31 such that when assembled together, the panels 31 combine to form the single or self-contained unit. Alternatively, the insert can be manufactured as one complete, continuous shell. In the particular embodiment shown in FIG. 2, the panels are assembled together to form a box having an aperture therethrough forming the product sensing aperture 43. The assembled insert 30 comprises at least one electrical contact point 32 that is configured to water-tightly engage to the at least one electrical contact point 21 of the housing aperture 20. The electrical contact points 32 are additionally connected to at least one set of sensing coils 33 mounted on a first layer 34 comprising a base board 42. Alternatively the electrical contact points 32 and 21 could be removed entirely by directly connecting the at least one set of sensing coils 33 to a control system 55 (not shown) of the metal detector. The base board 42 is fabricated so as to provide a former comprising at least one coil seat (59) for receiving and the mounting of the at least one set of sensing coils 33 as shown in FIG. 4. The base board 42 can be comprised of a synthetic resin paper that is designed to be rigid so as to provide mechanical stability. The base board has thickness in the range 5 mm to 50 mm for example 20 mm. The edges of each panel 31 comprise a seat 45 for receiving a seal. The seal can in one particular example of the present invention comprise a rubberised hermetic seal.

Figure 5:
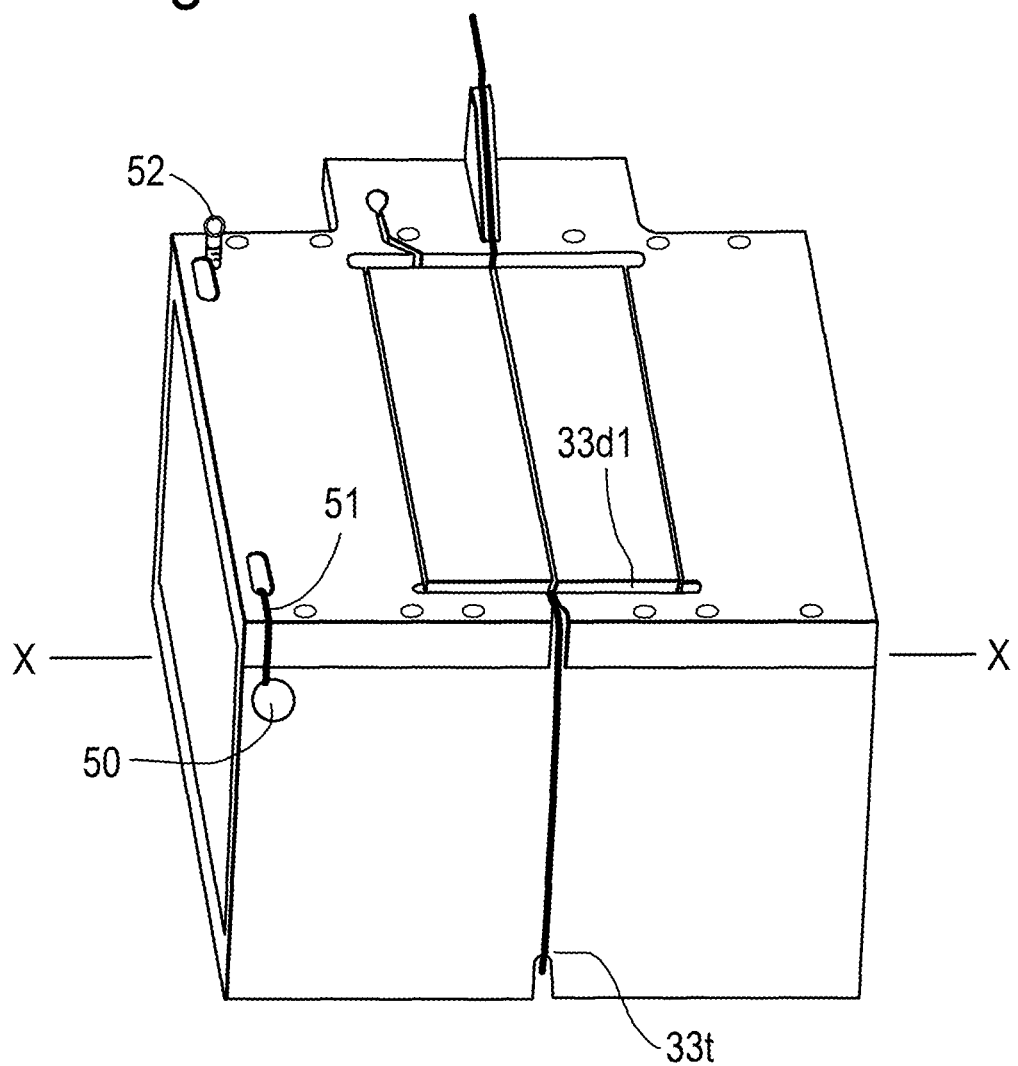
FIG. 5 is a schematic view of an assembled sensing head insert with sensing coils wound around the external surfaces of the insert according to an embodiment of the present invention.

Each set of sensing coils comprises at least one transmitter coil 33t suitable for transmitting an electromagnetic field; at least one detection coils 33d1 suitable for detection of an electromagnetic field. Although not exclusively required, in the particular example of the present invention two detection coils are utilised, 33d1 (shown in blue in FIG. 5) and 33d2 (not shown) in conjunction with one transmitter coil 33t (shown in red in FIG. 5). The coils 33 can be fabricated of any material that can carry a current and have currents induced in them by a changing electromagnetic field; for example in a particular example of the present invention, the coils 33 consist of copper metal. The coils 33 can be identical although this is not a prerequisite to functionality. The geometric centre of each of the detection coils 33d1, 33d2 are generally situated an equal distance from the geometric centre of the transmitter coil 33t such that the changing magnetic field provided by the transmitter coil 33t induces a current in the detector coils 33d1, 33d2. The orientation of each coil 33t, 33d1 and 33d2 within a given set of sensing coils 33 is important to the functionality of the metal detector. As taught in WO 2006/087510 (Spectrum Inspection Systems Ltd), the detection coils 33d are arranged in a plane perpendicular to the direction in which the object of interest is to pass as shown in FIG. 5 and electrically connected in parallel and each detection coil 33d1 and 33d2 is located on one side of the product only. When the detection coils 33d1 and 33d2 are connected in opposition, their output is cancelled, resulting in a zero value, i.e. the detector coil system is said to be in a perfectly balanced state. Depending upon the arrangement of the coil set 33, the detection coils 33d1, 33d2 are connected in opposition so that their induced voltages cancel. By connecting the detection coils 331d, 33d2 in parallel as described and shown in WO 2006/087510 (Spectrum Inspection Systems Ltd), in contrast to the more conventional series arrangement, the apparent power of the output signal is the same as for the series arrangement but the impedance value for the two coils 33d1, 33d2 is one quarter of that for an equivalent series arrangement. This greatly reduces the harmonics picked up by detection coils 33d1, 33d2.

Although not exclusively required, in the particular example of the present invention, the transmitter coil 33t surrounding the aperture of the metal detector, with its axis X-X arranged in a plane parallel to the product conveying direction, is driven by a powerful oscillator capable of generating a strong high frequency field within the aperture through which the object of interest passes. At opposing sides of the aperture are detection coils 33d1, 33d2 with their axes arranged perpendicular to the axis X-X. Other arrangements are permissible in the present invention, e.g. wherein the transmitter coil's 33*t* axis and the detection coils' 33*d*1, 33*d*2 axes are not perpendicular.

The sensing coils 33 can be mounted or wound to at least one coil seat (59) on the former either during manufacture of each panel 31 of the insert 30 or alternatively can be mounted or wound to the assembled insert 30 before being positioned within the metal detector housing aperture 20 such that for example the transmitter coils 33*t* is configured to wrap around the exterior of the sensing head insert whilst ensuring that on assembly into the metal detector, the transmitter coil axis X-X is parallel to the direction of product conveyance as shown in FIG. 5. Any combination of the above is also permissible; for example, detection coils 33*d*1, 33*d*2 can be mounted to the first layer 34, configured as the former, during manufacture of each panel 31 of the insert 30 and the transmitter coil 33*t* can be mounted after assembly of the insert before positioning the insert within the metal detector housing 11. Or alternatively, the sensing coils 33 can be wound to the assembled insert 30 such that the detection coils 33*d*1, 33*d*2 and transmission coils 33*t* may share the same axis X-X, i.e. the coils' axis are in the same plane.

Configured as a second layer 35 is a screen, bonded to the first layer 34. The second layer 35 is configured as an electric field shield (also known in the art as an electromagnetic shield), the fabrication and design of said second layer 35 is well known in the art and discussed in the introduction. According to a particular example of the present invention, the second layer 35 consists of metallic wiring laid onto a PCB of thickness in the range 0.3 mm to 5 mm, for example 0.7 mm. Alternatively, the second layer 35 can also consist of a painted graphite layer on a substrate suitable for said painting. Other examples of lining the inner walls of the product sensing aperture 43 of the insert 30 (i.e. to the first layer 34) with an electric field shield include inserting a single laminated sheet of a non-magnetic metal (e.g. copper) deposited or adhered onto a flexible substrate, e.g. polyimide. In the case of the non-magnetic metal being copper, it can either be in the form of an electro-deposited copper or rolled annealed copper. Electro-deposited copper provides an increased ductile surface whereas rolled annealed copper gives improved flexibility. The flexibility of the laminated screen layer allows the screen to be bent or manipulated to the shape of the aperture suitable for inserting as a single sheet body into the aperture of the assembled product sensing insert removing the need to separately line or paint each wall of the aperture or the separate panels 31 of the insert. The use of a single flexible laminated sheet comprising a layer of non-magnetic metal ensures good coverage of the inner walls of the aperture of the sensing head insert 30 whilst also providing manufacturing efficiency gains. An adhesive may be used to secure the laminated screen layer to the inner wall (to the first layer 34) of the aperture of the sensing head insert 30.

The flexibility of the laminated screen permits the electric field shield to be assembled into different shaped apertures or equally, different shaped sensing head inserts with minimal effort required to go between each configuration. For example, in an alternative embodiment of the present invention, the insert or former can be fabricated as a single body tube, e.g. cylindrical tube, having a tubular aperture for receiving the products to be tested. Grooves are machined to the outside of the tube for seating the sensing coils and/or the transmitter coils. The insert can be based on a resin impregnated fibre glass material. To line the inner walls of the product sensing aperture with the screen, the laminated screen is simply rolled to the shape of the aperture due to its flexible nature and inserted into the aperture. An adhesive may be used to bond the laminated screen to the inner wall of the aperture.

The first layer 34 is configured with at least one connection aperture 50 configured to permit at least one electrical connection 51 between the second layers 35 of adjacent panels 31 when the panels 31 are assembled into the sensing head insert 31 as shown in FIG. 5. The at least one electrical connection 51 can also comprise at least one grounding connection 52 of the electric field shielding.

Bonded to the second layer 35 is a third layer 36 configured as an moisture resistant barrier configured to be a lining for the product sensing aperture 43 and for protecting the screen and sensing coils 33 from moisture and/or cleaning products, e.g. caustic or corrosive fluids. The moisture resistant barrier 36 consists of any material that is suitably inert, non-porous and impermeable to moisture. It is preferred that the moisture resistant barrier 36 is fabricated of a material that complies with appropriate food contact legislation. To comply, the barrier 36 should be approved under the EU food contact material directives and FDA food contact material directives. For example according to the present invention, the moisture resistant barrier 36 is, according to a particular example of the present invention, fabricated of a high pressure laminate; for instance, a sheet of hardened paper, impregnated with phenolic resin, laminated on both sides with a layer of hardened paper, impregnated with melamine resin. In a particular example of the present invention the thickness of the high pressure laminate is in the range 1 mm to 10 mm, for example 2 mm. The advantage of using a moisture resistant barrier 36 made of this material is that the narrow thickness can be accurately controlled, the surface can be smoothed to a high precision and it is suitable for use with high pressure cleaning systems without degradation.

Figure 3:
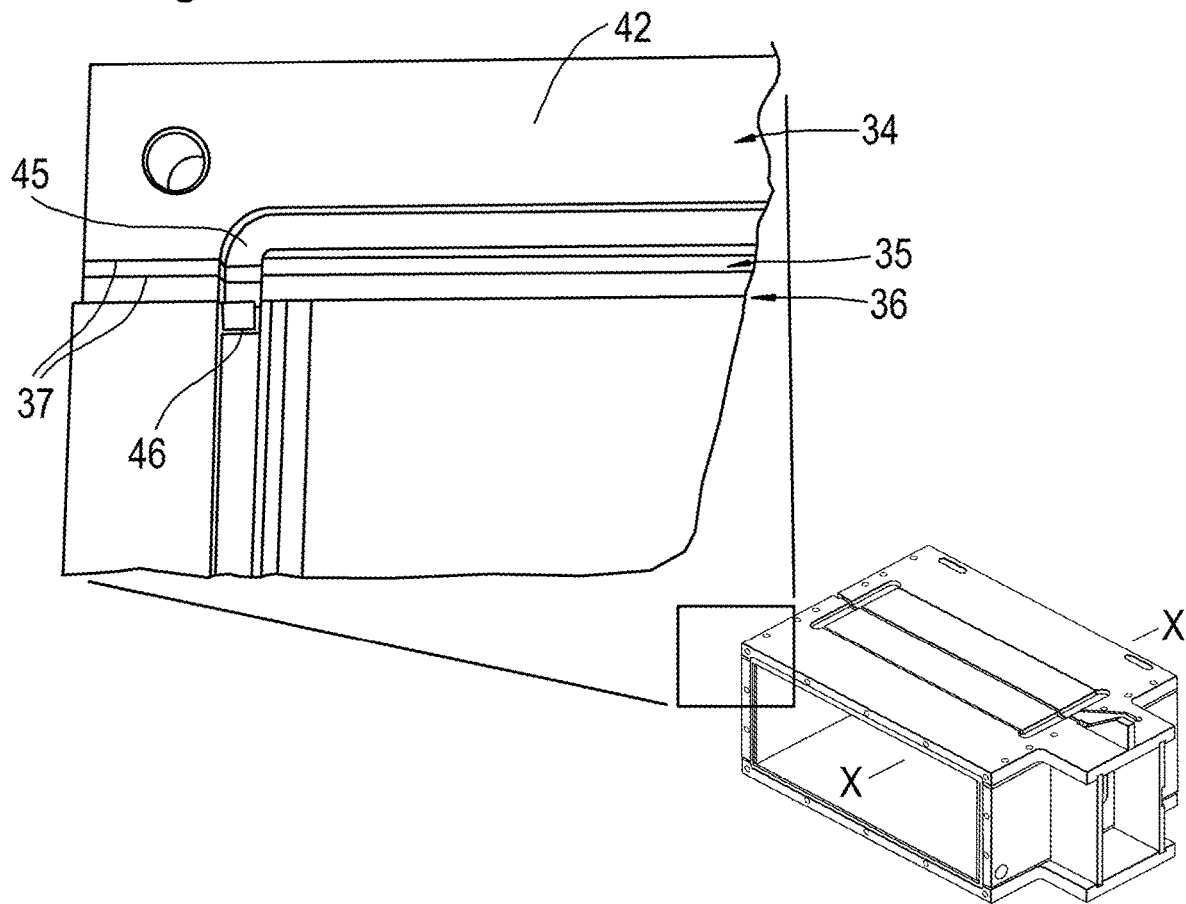
FIG. 3 is an expanded schematic view of a section of the assembled sensing head insert according to an embodiment of the present invention.

In order to laminate/bond/sandwich each of the layers: the first layer 34, the second layer 35 and the moisture resistant barrier 36 to one another in that order, a bonding substance 37 is used as shown in FIG. 3. According to a particular example of the present invention, this bonding substance 37 is an acrylic foam tape with a thickness in the range 0.1 mm to 5 mm, for example 0.4 mm is used. Once assembled as the single unit insert 30 as shown in FIG. 3, the moisture resistant barrier 36 becomes the interior walls of the insert 30 and thus the walls of the product sensing aperture 43, and the first layer 34 becomes the exterior walls of the insert 30. It should be understood that additional layers of auxiliary material may be bonded to the exterior wall of the first layer 34 so as to increase the volume occupied by the insert. These auxiliary layers can be configured to reduce the effect that external electromagnetic fields have on the metal detector 10. According to a particular example of the present invention the combined width of all the layers in each panel is in the range 6.5 mm to 75 mm, it can be 23 mm.

It is important that the orientation of the sensing coils 33 remains constant throughout the operational lifetime of the metal detector 10. To facilitate this important condition, the plurality of panels 31 that are constructed with a lamination of the first layer 34, the second layer 35 and the moisture resistant barrier 36, may comprise a number of alignment pins 38 (not shown) and alignment pin apertures 39*a* (shown in FIG. 4) so that the panels 31 are aligned at a predetermined orientation to each other as shown in FIG. 3. These alignment pins 38 can be made of any suitable material that resists warping under the extreme fluctuations in temperature during cleaning. The panels of the present invention are fabricated out of materials of substantially low and similar thermal expansion coefficient. This choice results in minimal panel movement during extreme temperature fluctuations which could negatively impact on the performance of the metal detector sensitivity. If the layers of each panel were to have substantially different thermal expansion coefficients under extreme temperature fluctuations the panels could delaminate.

The alignment pins 38 of one panel 31 cooperate with and fit snuggly into the alignment apertures 39a of another panel 31 such that the position of the panels 31 remains consistent throughout use. It should be understood that any suitable alignment method can be used which fulfils the use of maintaining the orientation of the panels 31 to one another, this includes but is not exclusively limited to screws, clips, glue, interlocking joints for example a dovetail joints; a combination of these mechanisms may be used to achieve the required alignment. Each panel 31 is further secured to each adjacent panel 31 to form a hermetic seal 46 and according to a particular example of the present invention this seal is a silicone sealant or rubberised strip.

Figure 2A:
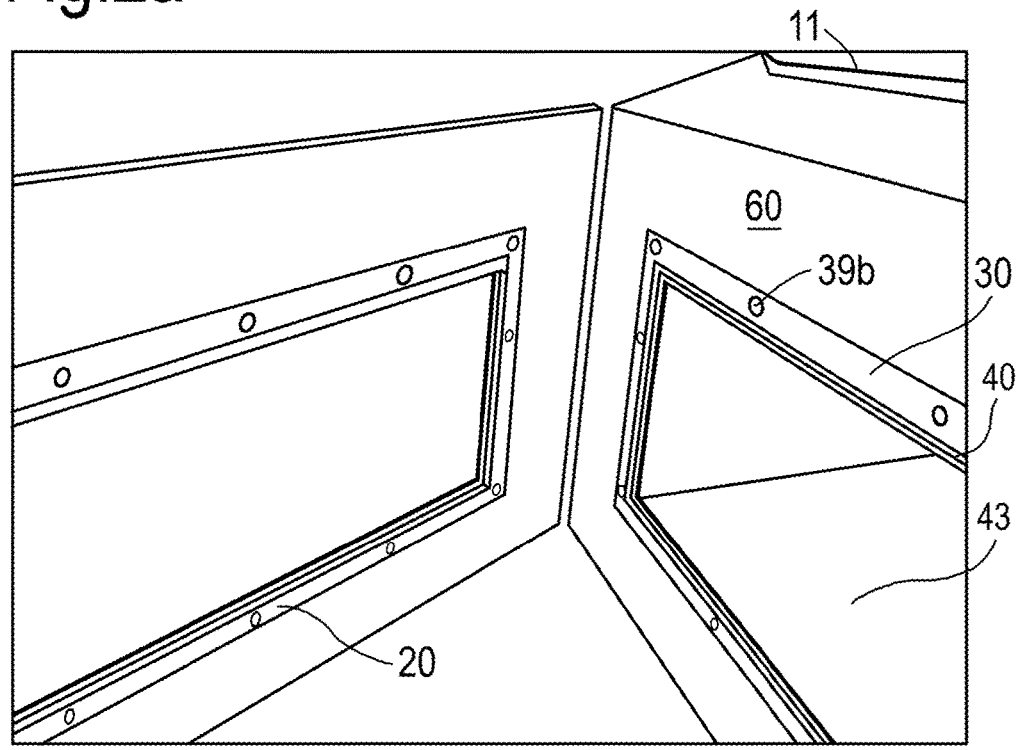
FIG. 2a is a schematic side sectional view showing the product sensing aperture of the metal detector.

The assembled insert 30 is securely held in position in the metal detector housing 11 by substantially filling or injecting the cavity or space between the assembled insert 30 and the metal detector housing 11 with foam 60, preferably expandable foam (see FIG. 2a). In the particular embodiment of the present invention, the foam is a closed-cell polyurethane rigid foam from BASF® but other expandable foams are permissible in the present invention that has the necessary structural integrity to secure the insert 30 in position in the metal detector housing 11. Such expandable foams are typically found in fridge freezers. As is known in the art, the liquid foam precursor is injected into the cavity. The chemical reactions taking place in the precursor causes the liquid precursor to expand as gasses are generated to form into a closed-cell foam. The assembled insert 30 is placed in the metal detector housing 11 such that the aperture or mouth 43 of the insert 30 which defines the product sensing aperture cooperates with the housing aperture 20 of the metal detector housing 11. The assembled insert 30 is placed into the housing aperture 20 of the metal detector 10 and fixedly secured in position by any suitable fastener. To seal the insert against the housing aperture of the metal detector, as shown in FIG. 2 and FIG. 2a, the perimeter around the aperture or mouth of the insert 30 can also comprise a hermetic seal 40 seated in the seat 45 that engages with a flange 44 (not shown) of the metal detector housing 11 or the mouth of the metal detector housing aperture 20. In a particular example of the present invention, this seal 40 is a rubberised O-ring seal and prevents fluid from ingress into the volume between the insert 30 and the housing aperture 20. This volume can be additionally be filled with a foam. The physical properties of this foam have the added advantages that the foam provides increased stability for changes in thermal conditions; it provides increased structural rigidity of the sensing head insert 30; it aids in securing the sensing coils 33 to the panel 31 and also dampens vibrations caused by external influences on the metal detector. Vibrations can be further damped by injecting the foam into the metal detector housing 11. To ensure the metal detector aperture is fixedly secured against the mouth of the product sensing aperture 43, also shown in FIG. 2a, the perimeter around the mouth of the product sensing aperture 43 comprises holes 39b which cooperates with the holes of the metal detector aperture 20 for reception of threaded bolts or screws. One or more adhesives may also be used to fixedly secure the mouth of the insert 30 against the metal detector aperture 20.

Figure 2B:
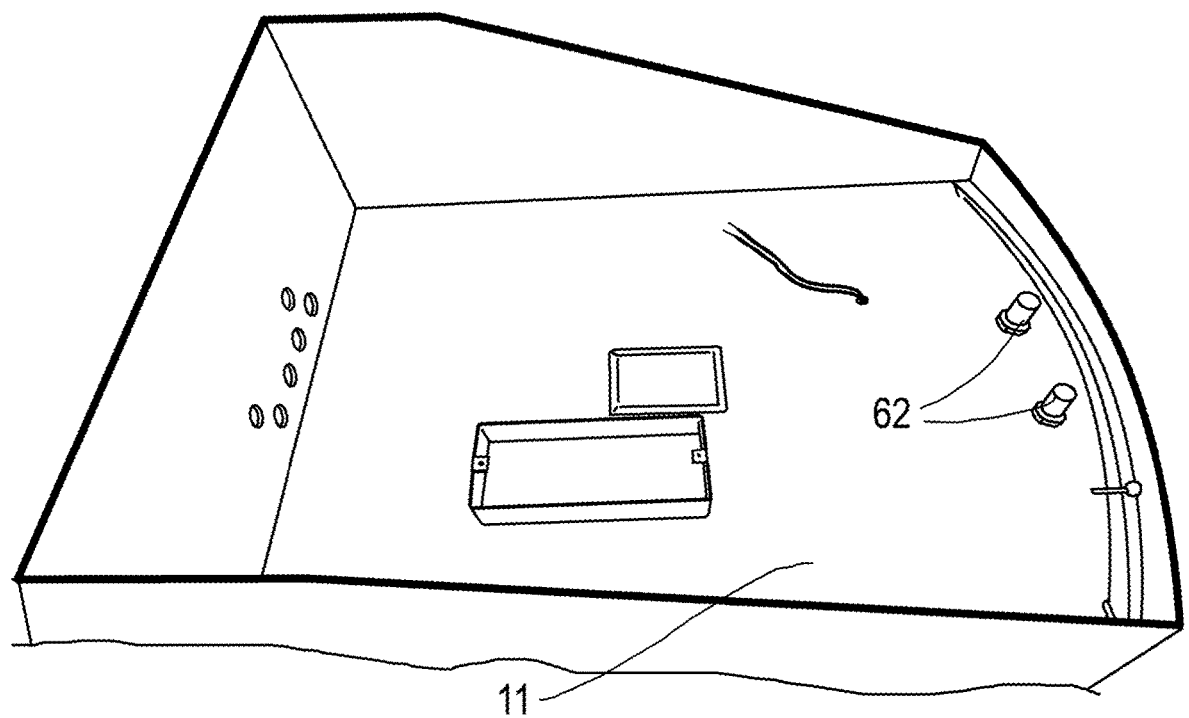
FIG. 2b is a schematic view of the underside of a panel of the metal detector housing showing the pressure release vents.

The assembled insert 30 should be sufficiently robust to withstand the forces experienced when the foam expands within the metal detector housing 11. Without the necessary support, the pressure exerted by the expanding foam is sufficient to cause the assembled insert 30 to collapse or at least cause damage to the joint between adjacent panels. In the particular embodiment of the present invention, one or more release vents or valves 62 are mounted to the metal detector housing 11 to mitigate this excessive increase in pressure from the expanding foam causing damage to the assembled insert 30 (see FIG. 2b). However, the pressure release vents 62 should be sized or the number of pressure release vents needs to be controlled in order to ensure that the cavity between the metal detector housing 11 and the assembled insert 30 is substantially filled with foam and cured to an adequate density so as to provide the necessary support to the assembled insert 30 in the metal detector housing 11, i.e. to prevent the assembled insert 30 from moving within the metal detector housing 11, e.g. during transport. For example, the pressure release valves 62 can be sized to control the flow of air or liquid foam precursor through the valve when the foam is expanding in the metal detector housing 11 such that the foam expands and cures to a predetermined density that is sufficient to provide adequate support to the assembled insert 30 in the metal detector housing but not too great that the forces generated by the expansion cause damage the assembled insert 30, in particular the joint between adjacent panels. Too little density of the foam would not provide adequate support to the assembled insert 30 in the metal detector housing. Too high density of the foam would cause incomplete filling of the cavity. Typically, the density of the cured expandable polyurethane foam is in the range between 0.2 to 0.40 g/cm$^3$, preferably between 0.25 to 0.35 g/cm$^3$, more preferably 0.25 g/cm$^3$-0.30 g/cm$^3$. Ideally, the density of the cured foam is 0.27 g/cm$^3$. Knowing the volume of the cavity, the density is determined by injecting a known or pre-determined weight of the liquid foam precursor material into the cavity of known volume and calculating the density based on the equation:—

$$\text{Density} = \text{Mass/Volume} \quad (1)$$

The volume of the cavity between the metal detector outer housing and the sensing head insert 30 is calculated by subtracting the volume of the insert from the internal volume of the metal detector housing. The internal volume of the metal detector housing and the volume of the insert can be obtained through measurement, e.g. from specification drawings. Although some of the foam may expand through the pressure release vents, the amount of foam that escapes through the vents is insignificant to greatly affect the density values. Alternatively and to confirm the measured density of the foam in the cavity, sections of foam are cut out from the cured foam between the insert 30 and the metal detector housing 11, determining its volume (e.g. in the case of a cube–length width×height) and calculating the density using the same equation 1 above. For example, 100 mm by 100 mm by 100 mm cubes cut from the foam are used to determine the density of the foam. The density measurement take into consideration the pores within the foam structure.

In the particular embodiment of the present invention, both the pressure release vents or valves 62 and the mechanical fasteners securing adjacent panels together are sized so as to control the density of the foam in the cavity and thereby, improve the support offered by the expandable foam. The combination of an adhesive, one or more screws and alignment pins 38, e.g. dowels, to mechanically fasten adjacent panels removes the requirement to carefully control the rate at which the vents release pressure. The absence of any one of these mechanical fasteners would result in damage to the assembled insert 30, in particular the joint between adjacent panels.

Figure 2C:
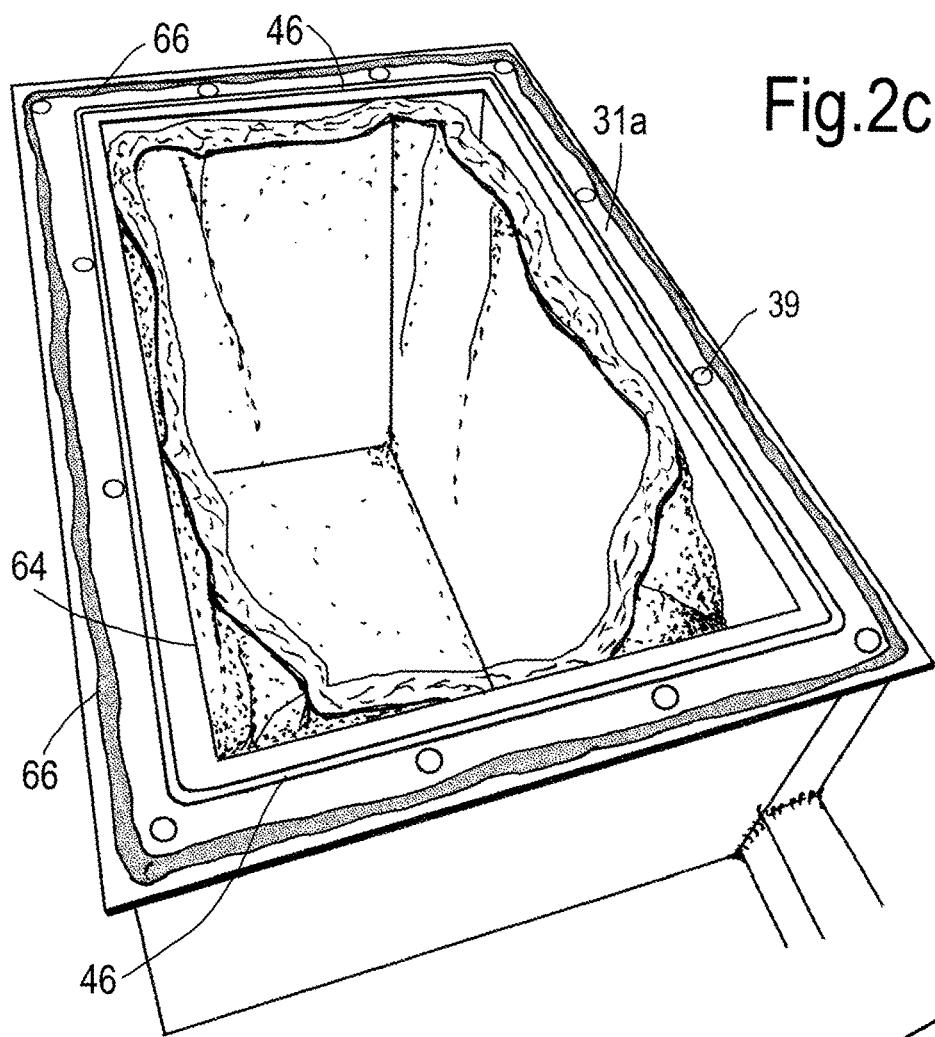
FIG. 2c is a schematic view of the product sensing aperture of the sensor head insert viewed from above.

FIG. 2c shows a top view of the product sensing aperture 43 of the assembled insert 30 showing the various fasteners used to fixedly secure the assembled insert 30 to the metal detector housing 43. Whilst FIG. 2c shows the edge of the panels that define the product sensing aperture 20, the same fasteners can be used to assemble adjacent panels of the insert 30 together. The edge or ends 31a of the panels 31 comprises a strip of adhesive. In particular embodiment of the present invention as shown in FIG. 2c, an inner strip 64 and an outer strip 66 of adhesive are used to mechanically fasten adjacent panels 31 together. The outer strip 66 of adhesive is a methacrylate based adhesive and the inner strip 64 of adhesive is a polyurethane based adhesive. The use of two strips of adhesive 64, 66 improves the adhesion between adjacent panels, particularly at the edges of adjacent panels that are vulnerable to ingress of moisture. However, a single strip of adhesive is permissible in the present invention. Between the strips of adhesive is shown a seal or gasket 46 or O-ring to hermetically seal adjacent panels together. In the particular embodiment shown in FIG. 2c, the seal 46 is a silicone based rubberised seal. Also shown in FIG. 2c is a plurality of holes 39b for the reception of bolts (e.g. threaded bolts) to fix the insert 30 to the metal detector housing aperture 20.

Figure 2D:
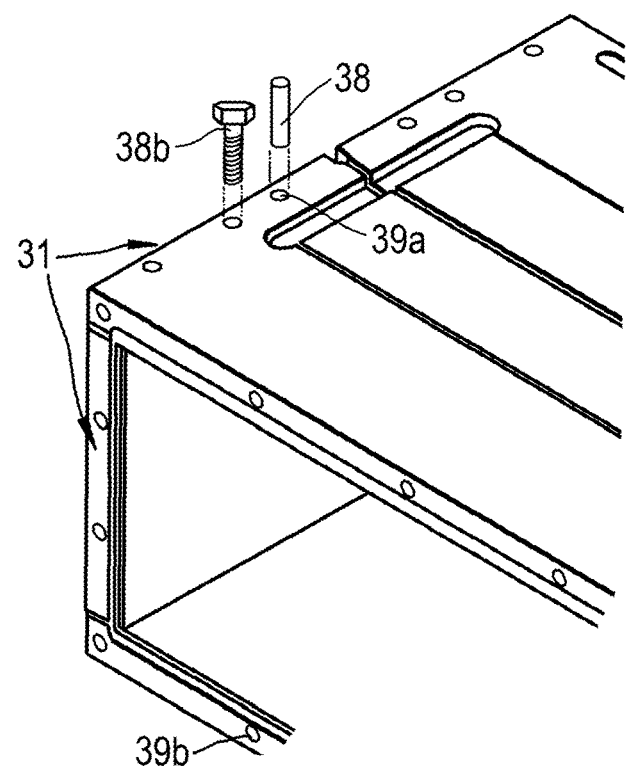
FIG. 2d is a schematic view of a joint between adjacent panels of the sensor head insert.

In FIG. 2d showing a schematic view of the joint between adjacent panels, a plurality of holes 39a is shown for receiving complementary pins 38 or dowels. In addition to the use of an adhesive discussed above and alignment pins 38 to mechanically join adjacent panels together, one or more screws or threaded bolts 38b are also used to mechanically join adjacent panels together (see FIG. 2d). The holes 39b at the edge of the panels adjacent the product sensing aperture are also sized to receive the threaded bolts or screws. Thus, by the use of a mechanical fastener comprising a combination of an adhesive, alignment pins, e.g. dowels and one or more threaded screws or bolts in combination with the predetermined sized and/or number of pressure release vents or valves ensures that the join between adjacent panels is sufficiently strong to absorb the forces from the expanding foam and yet be able to generate sufficient pressure within the cavity between the assembled insert and the metal detector housing for the foam to expand and cure to a predetermined density sufficient to provide support to the assembled insert.

Using a laminated insert that can be assembled of laminated panels comprising the first layer 34, the second layer 35 and the moisture resistant barrier 36 holds a number of advantages over traditional system. In the prior art, the former 34 is traditionally built into the metal detector housing together with the electronics. Mounting the sensing coils 33 to the insert 30, according to the present invention, allows for simple removal from the metal detector should the need arise to replace them. Another benefit that producing the insert 30 as an easy to assemble complete unit is that the production can be outsourced to a separate manufacturer. This reduces the hours that a company must put in when producing a completed metal detector thus increasing productivity as well as providing cost savings. An additional benefit is that the distance from each sensing coil 33 to the centre of the product sensing aperture 43 (parameter determining metal detector sensitivity) is minimised by mounting/winding the coils on the insert 30 whilst maintaining industry standard sizes of aperture, for example a standard aperture could be 300 mm by 150 mm. In traditional metal detectors this distance cannot be minimised to such an extent due to the nature of individually assembling components within the detector. A furthermore additional benefit that making use of the insert provides is that the volume within the detection aperture 20 that a product can be occupy is maximised whilst still minimising the distance between the sensing coils 33 and the product, thus the accuracy of the metal detector is improved.

Further features include:
1. A panel (31) for assembly into a sensing head for a metal detector comprising:
   a. a first layer (34) for supporting at least one sensing coil (33),
   b. a second layer (35) for providing electromagnetic shielding, and
   c. a moisture resistant barrier layer (36).
2. The panel (31) according to feature 1; wherein the first layer (34), the second layer (35) and the moisture resistant barrier layer (36) are adhered together.
3. The panel (31) according to feature 2, wherein the first layer (34), the second layer (35) and the moisture resistant barrier (36) are adhered together using a bonding tape.
4. The panel (31) according to feature 3, wherein the bonding tape is an acrylic foam tape.
5. The panel (31) according to feature 4, wherein the bonding tape is double sided.
6. The panel (31) according to any of the preceding features 1 to 5, wherein the panel has a thickness in the range of substantially 6.5 mm to 75 mm; preferably in the range of substantially 15 mm to 30 mm; more preferably the thickness is substantially 23 mm
7. The panel (31) according to any of the preceding features 1 to 6, wherein the moisture resistant barrier (36) comprises a high pressure laminate composite.
8. The panel according to any of the preceding features 1 to 7, wherein the panel comprises at least one coil seat (59) for receiving the at least one sensing coil.
9. The panel according to any of the preceding features 1 to 8, the panel comprises a seat (45) for receiving a seal.
10. A sensing head insert (30) for a metal detector comprising an assembly of panels (31) as defined in any of the features 1 to 9.
11. The insert (30) according to feature 10, wherein the panels (31) are assembled to form a product sensing aperture (43) for receiving products to be tested.
12. The insert of feature 11, wherein the mouth of the aperture comprises a seal.
13. The insert (30) according to any of the features 10 or 12, wherein the insert (30) is configured to support at least two sensing coils (33).
14. The insert (30) according to feature 13, wherein the at least two coils (33) comprises a transmitter coil (33t) for generating an electromagnetic field and a detector coil (33d).
15. The insert (30) according to any of the features 10 or 14, wherein the panels (31) are secured to each other such that each panel (31) is aligned at a pre-determined orientation to another.
16. The insert (30) according to feature 15, wherein each panel (31) comprises alignment means configured for aligning the panels (31) at a pre-determined orientation to each other.

17. The insert (30) according to feature 16 whereby the alignment means comprises alignment pins (38) and alignment holes (39a) arranged so that the pins (38) and holes (39a) of different panels (31) cooperate.
18. The insert (30) according to feature 15 or 17, each panel (31) are secured together by at least one dovetail joint.
19. The insert according to any of the features 14 to 18, wherein the each panel are secured to each other to form a hermetic seal (46).
20. The insert (30) according to any of the features 10 to 19; wherein the insert (30) further comprises at least one electrical contact point (32).
21. A metal detector comprising a metal detector aperture for housing the insert as defined in any of the features 10 to 20.
22. The metal detector of feature 21 whereby the insert (30) is fixedly secured to a housing aperture (20) of the metal detector housing (11).
23. The metal detector of feature 21 or 22, wherein the insert is sealed against a flange (44) of the metal detector housing aperture (20).
24. The metal detector (30) according to feature 21 or 22 wherein the metal detector housing (11) comprises at least one electrical contact point (21) for cooperating with the electrical contact points (32) of the insert.
25. A method for manufacturing a panel (31) comprising the step of bonding layers of:
    a. a first layer for supporting at least one sensing coil;
    b. a second layer for providing electromagnetic shielding, and
    c. a moisture resistant barrier layer.
26. A method for manufacturing an insert as defined in any of the features 10 to 20, comprises the steps of:
    a. assembling panels as defined in any of the features 1 to 9 to form an insert comprising a product sensing aperture.
27. The method of feature 26, further comprising the step of:
    a. winding at least one sensing coil around the exterior surface of the insert.
28. A method for assembling a sensing head insert into a metal detector comprising the steps;
    a. inserting the insert of any of the features 10 to 20 into a metal detector housing aperture;
    b. sealing the insert to the metal detector housing aperture.
29. The method of feature 28, further comprises the step of:
    a. injecting a sealant between the insert and the interior surface of the metal detector housing aperture.

The invention claimed is:

1. A sensing head insert for a metal detector comprising an assembly of panels having a product sensing aperture for receiving products to be tested, each of said panels comprising a laminated assembly of:
    a. a first layer for supporting at least one sensing coil,
    b. a second layer for providing electromagnetic shielding, and
    c. a moisture resistant barrier layer comprising a high pressure laminate composite;
    wherein adjacent panels are secured together by a mechanical fastener; said mechanical fastener comprising:
    i) one or more screws or dovetail joints;
    ii) an adhesive; and
    iii) an alignment means configured for aligning the panels at a pre-determined orientation to each other, wherein the alignment means comprises alignment pins and alignment holes arranged so that the pins and holes of different panels cooperate.

2. The insert according to claim 1, wherein adjacent panels are hermetically sealed by a rubberised strip.
3. The insert according to claim 2, wherein the rubberised strip is an O-ring.
4. The insert according to claim 2, wherein at least one of the panels comprises a seat for receiving the rubberised strip.
5. The insert according to claim 1, wherein the first layer, the second layer and the moisture resistant barrier layer of each panel are adhered together.
6. The insert according to claim 1, wherein each panel has a thickness in the range of substantially 15 mm to 30 mm.
7. The insert according to claim 1, wherein the panel comprises at least one coil seat for receiving the at least one sensing coil.
8. The insert of claim 1, wherein a mouth of the aperture comprises a seal.
9. The insert according to claim 1, wherein the insert is configured to support a transmitter coil for generating an electromagnetic field and each detector coil.
10. A metal detector comprising an insert as defined in claim 1 housed within a metal detector housing, said metal detector housing comprises a metal detector aperture in cooperation with the product sensing aperture of the insert, wherein a space between the metal detector housing and the insert is substantially filled with foam.
11. The metal detector according to claim 10, wherein the foam is an expandable foam.
12. The metal detector according to claim 10, wherein the foam comprises a polyurethane foam.
13. The metal detector according to claim 12, wherein the foam has a density in the range of 0.20 g/cm$^3$-0.40 g/cm$^3$.
14. The metal detector of claim 10, whereby the insert is fixedly secured to the metal detector aperture of the metal detector housing.
15. The metal detector of claim 14, wherein the insert is sealed against a flange of the metal detector aperture.
16. The metal detector according to claim 10, wherein the metal detector housing comprises at least one electrical contact point for cooperating with at least one corresponding electrical contact point of the insert.
17. A metal detector comprising an insert housed within a metal detector housing, wherein the metal detector housing comprises a metal detector aperture in cooperation with the product sensing aperture of the insert, wherein the metal detector housing comprises one or more pressure release vents or valves for controlling the density of the foam within the space, wherein a space between the metal detector housing and the insert is substantially filled with foam, and wherein the insert comprises an assembly of panels having a product sensing aperture for receiving products to be tested, each of the panels comprising a laminated assembly of:
    a. a first layer for supporting at least one sensing coil,
    b. a second layer for providing electromagnetic shielding, and
    c. a moisture resistant barrier layer;
    wherein adjacent panels are secured together by a mechanical fastener; the mechanical fastener comprising:
    i) one or more screws or dovetail joints;
    ii) an adhesive; and
    iii) an alignment means configured for aligning the panels at a pre-determined orientation to each other, wherein the alignment means comprises alignment pins and alignment holes arranged so that the pins and holes of different panels cooperate.

18. A method for manufacturing a metal detector comprising the steps of:
   a. fixing a sensing head insert to an aperture of a metal detector housing, the sensing head insert comprising an assembly of panels having a product sensing aperture for receiving products to be tested, each of the panels comprising a laminated assembly of:
   1. a first layer for supporting at least one sensing coil,
   2. a second layer for providing electromagnetic shielding, and
   3. a moisture resistant barrier layer;
   wherein adjacent panels are secured together by a mechanical fastener; the mechanical fastener comprising:
      A) one or more screws or dovetail joints;
      B) an adhesive; and
      C) an alignment means configured for aligning the panels at a pre-determined orientation to each other, wherein the alignment means comprises alignment pins and alignment holes arranged so that the pins and holes of different panels cooperate;
   b. injecting expandable precursor foam material in a space between the metal detector housing and the sensing head insert; and
   c. injecting a sealant between the sensing head insert and an interior surface of the metal detector housing aperture.

19. A method for manufacturing a metal detector comprising the steps of:
   a. fixing a sensing head insert to an aperture of a metal detector housing, the sensing head insert comprising an assembly of panels having a product sensing aperture for receiving products to be tested, each of the panels comprising a laminated assembly of:
   1. a first layer for supporting at least one sensing coil,
   2. a second layer for providing electromagnetic shielding, and
   3. a moisture resistant barrier layer;
   wherein adjacent panels are secured together by a mechanical fastener; the mechanical fastener comprising:
      A) one or more screws or dovetail joints;
      B) an adhesive; and
      C) an alignment means configured for aligning the panels at a pre-determined orientation to each other, wherein the alignment means comprises alignment pins and alignment holes arranged so that the pins and holes of different panels cooperate;
   b. injecting expandable precursor foam material in a space between the metal detector housing and the sensing head insert; and
   c. installing a seal between the sensing head insert and an interior surface of the metal detector housing aperture.

* * * * *